(12) United States Patent
Yasuda et al.

(10) Patent No.: US 10,294,581 B2
(45) Date of Patent: May 21, 2019

(54) PLATING METHOD

(71) Applicant: EBARA CORPORATION, Tokyo (JP)

(72) Inventors: Shingo Yasuda, Sacramento, CA (US); Akira Owatari, Sacramento, CA (US)

(73) Assignee: EBARA CORPORATION, Tokyo (JP)

( * ) Notice: Subject to any disclaimer, the term of this patent is extended or adjusted under 35 U.S.C. 154(b) by 559 days.

(21) Appl. No.: 14/872,292

(22) Filed: Oct. 1, 2015

(65) Prior Publication Data

US 2016/0097141 A1  Apr. 7, 2016

Related U.S. Application Data

(60) Provisional application No. 62/060,543, filed on Oct. 6, 2014.

(51) Int. Cl.

| | | |
|---|---|---|
| *C25D 3/38* | (2006.01) | |
| *C25D 5/00* | (2006.01) | |
| *C25D 5/18* | (2006.01) | |
| *C25D 7/12* | (2006.01) | |
| *H05K 3/18* | (2006.01) | |
| *C25D 17/00* | (2006.01) | |
| *C25D 21/10* | (2006.01) | |
| *C25D 21/14* | (2006.01) | |

(Continued)

(52) U.S. Cl.
CPC .............. *C25D 21/14* (2013.01); *C25D 3/38* (2013.01); *C25D 5/003* (2013.01); *C25D 5/18* (2013.01); *C25D 7/123* (2013.01); *H01L 21/2885* (2013.01); *H01L 21/76877* (2013.01); *C25D 17/007* (2013.01); *C25D 21/10* (2013.01); *H05K 3/188* (2013.01); *H05K 2203/163* (2013.01)

(58) Field of Classification Search
CPC ......... C25D 7/12–7/126; C25D 17/001; C25D 3/38–3/40
See application file for complete search history.

(56) References Cited

U.S. PATENT DOCUMENTS 3,474,088 A * 10/1969 Mizuta .................... H01L 21/00
257/471
4,750,977 A *  6/1988 Marrese ................... C25D 5/20
205/148

(Continued)

FOREIGN PATENT DOCUMENTS

| JP | S54-028234 A | 3/1979 |
|---|---|---|
| JP | 58-045400 A | 3/1983 |

(Continued)

*Primary Examiner* — Bryan D. Ripa
*Assistant Examiner* — Ho-Sung Chung
(74) *Attorney, Agent, or Firm* — Baker & Hostetler LLP

(57) ABSTRACT

A method of plating a substrate, such as a wafer, by applying a voltage between the substrate and an anode is disclosed. The plating method includes: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; and shutting off a reverse electric current, which flows from the insoluble anode to the substrate via the plating power source, by a diode disposed between the insoluble anode and the substrate when the predetermined plating voltage is not applied.

5 Claims, 13 Drawing Sheets

(51) Int. Cl.
*H01L 21/288* (2006.01)
*H01L 21/768* (2006.01)

(56) References Cited

U.S. PATENT DOCUMENTS

| | | | | |
|---|---|---|---|---|
| 6,251,236 | B1 * | 6/2001 | Stevens | C25D 17/12 204/224 R |
| 7,622,024 | B1 * | 11/2009 | Mayer | C25D 17/12 204/198 |
| 2002/0060157 | A1 * | 5/2002 | Calvert | C25D 21/12 205/82 |
| 2004/0134682 | A1 * | 7/2004 | En | C23C 18/1607 174/258 |
| 2007/0272560 | A1 * | 11/2007 | Gonzalez | C25D 3/38 205/296 |
| 2010/0032303 | A1 * | 2/2010 | Reid | C25D 17/002 205/96 |
| 2014/0042032 | A1 * | 2/2014 | Shimoyama | C25D 5/18 205/118 |
| 2015/0218724 | A1 * | 8/2015 | Mevellec | C25D 3/38 205/104 |

FOREIGN PATENT DOCUMENTS

| | | | |
|---|---|---|---|
| JP | 61-204397 A | 9/1986 | |
| JP | 05-043104 A | 10/1993 | |
| JP | 10-152799 A | 6/1998 | |
| JP | 2005-213575 A | 8/2005 | |
| JP | 2007-169700 A | 7/2007 | |
| JP | 2011-058034 A | 3/2011 | |
| WO | WO-2012175249 A1 * | 12/2012 | C25D 3/38 |
| WO | WO 2014044942 A1 * | 3/2014 | C25D 3/38 |

\* cited by examiner

PLATING METHOD

CROSS REFERENCE TO RELATED APPLICATION

This document claims priority to U.S. Provisional Patent Application No. 62/060,543 filed Oct. 6, 2014, the entire contents of which are hereby incorporated by reference.

BACKGROUND

A copper plating process is widely used in the fields of semiconductor devices and printed wiring. A plating apparatus for performing the copper plating process will be described with reference to FIG. 13. As shown in FIG. 13, the plating apparatus includes a plating bath 100 for holding a plating solution therein, an anode 101 immersed in the plating solution retained in the plating bath 100, an anode holder 102 holding the anode 101, and a substrate holder 103 for holding a substrate W. The substrate W and the anode 101 are disposed in the plating solution in the plating bath 100 such that they oppose each other. The anode 101 is coupled to a positive pole of a power source 104, while the substrate W is coupled to a negative pole of the power source 104. When a voltage is applied between the anode 101 and the substrate W, an electric current flows from the anode 101 through the plating solution to the substrate W, whereby the substrate W is plated. Such an electric current, flowing from the anode 101 through the plating solution to the substrate W, will be hereinafter referred to as a forward electric current.

A soluble anode, which is composed of, e.g., phosphorus-containing copper, may be used as the anode 101. However, the use of such a soluble anode can cause a deposition of a black film on a surface of the anode 101. Since it is difficult to appropriately perform plating of the substrate W while controlling the deposition of the black film, a defect may be produced in a copper film formed on the surface of the substrate W.

FIG. 14A is a schematic view showing a cross section of the surface of the substrate W. As shown in FIG. 14A, a recess 110, which is called via-hole, is formed in a surface of a dielectric film 109. Further, a conductive layer 114, such as a seed layer, is formed on a flat surface of the dielectric film 109 and on a surface of the recess 110. In a process of depositing metal in the recess 110 having a high aspect ratio, such as TSV (Through Silicon Via), an additive, including a suppressor for suppressing the deposition of the metal, is used to prevent the deposition of the metal in an area around an opening of the recess 110. However, when a soluble anode containing copper is used, the copper dissolves in the form of monovalent copper ions ($C^+$), which combine with the additive, thus reducing the additive.

In view of this, in recent years, an insoluble anode tends to be used instead of the soluble anode. When copper plating is carried out using an insoluble anode as the anode 101, copper ions are reduced on the substrate W and a copper film is formed on the substrate W, while electrolysis of water occurs on the anode 101, whereby oxygen is generated. When the application of the voltage is stopped, an electric current flows from the anode 101 to the substrate W via the power source 104 as shown in FIG. 13, because the substrate W and the anode 101, which are composed of different metals, have different spontaneous potentials in the plating solution. Thus, the electric current flows in a direction opposite to the direction of the electric current that flows during plating of the substrate W, resulting in dissolution of the copper film formed on the substrate W. Such electric current, flowing in the opposite direction, will be hereinafter referred to as a reverse electric current.

A magnitude of the reverse electric current depends mainly on a concentration of dissolved oxygen in the plating solution and is likely to increase especially when the concentration of dissolved oxygen is high immediately after plating. The reverse electric current is likely to flow when the insoluble anode is used which causes a large potential difference between the insoluble anode and the substrate W. In contrast, the reverse electric current hardly flows when the soluble anode is used which is composed of phosphorus-containing copper, i.e., the same kind of metal as the substrate W.

Copper dissolves as monovalent copper ions ($C^+$) or divalent copper ions ($C^{2+}$) in the plating solution. The monovalent copper ions are unstable and are therefore immediately oxidized into divalent copper ions. If an accelerator (e.g., SPS) for accelerating deposition of a metal is included in additives, the accelerator is reduced in a reaction to oxidize the monovalent copper ions ($C^+$), whereby characteristics of the additives change. For example, when SPS is used as the accelerator, SPS will be reduced into MPS.

A balance between the suppressor and the accelerator is of importance in order to allow a metal to deposit preferentially from a bottom of the recess 110, i.e., to effect so-called bottom-up growth of the metal. If the reverse electric current flows and the additive (accelerator) is reduced, the balance between the suppressor and the accelerator will be lost, resulting in a formation of a defect, such as a void, in the recess 110.

As described above, if the reverse electric current flows between the substrate W and the anode 101, SPS will be reduced and MPS will be present in excess in the plating solution. If NIPS, having a strong effect to accelerate copper plating, is present in excess in the plating solution, an area where plating should be suppressed by the suppressor will be plated, resulting in a formation of a defect, such as a void, in the recess 110. Thus, in that case, MPS behaves as an electrolyte component that inhibits bottom-up plating on the substrate W.

In an example illustrated in FIG. 14B, a photoresist 111 is formed on the conductive layer 114. When the voltage is applied between the substrate W and the anode 101, copper 112 is deposited in an opening of the photoresist 111 and in the recess 110. However, if the balance between the suppressor and the accelerator is lost, the bottom-up growth of copper 112 is not achieved and a depression 113, which is called a dimple, may be formed in the copper 112 lying above the recess 110.

Also in a process of depositing copper 112 on a substrate W which does not have the photoresist 111 as shown in FIG. 14C, a surface of the copper 112 may not be flat after plating and a depression 113 may be formed. Moreover, a void may be formed in the recess 110.

In an example illustrated in FIG. 14D, the conductive layer 114 is formed on an underlying interconnect 115, and the photoresist 111 is formed on the conductive layer 114. Also in a plating process of depositing copper 112 in the opening of the photoresist 111 (the formation of a bump), the effect of the additive may be inhibited, resulting in a formation of irregularities in the surface of the copper 112 or a formation of a bump having an abnormal shape.

In this specification, the bottom-up plating refers to a plating technique for achieving a desired morphology in a to-be-plated area as shown in FIGS. 14A through 14D. Specifically, the bottom-up plating refers to a plating technique which effects gradual progress of plating from a bottom of an opening or a bottom of a recess surrounded by a dielectric material (including a photoresist). A failure to achieve the bottom-up plating will result in, for example, an abnormal shape of deposited metal or the formation of void in deposited metal.

SUMMARY OF THE INVENTION

According to an embodiment which will be described below, there is provided a plating method capable of preventing a change in characteristics of an additive. More specifically, there is provided a plating method capable of plating a substrate, such as a wafer, while preventing a production of an electrolyte component that inhibits bottom-up plating.

In one embodiment of a plating method, there is provided a method for plating a substrate while preventing a generation of an electrolyte component which inhibits bottom-up plating of the substrate, comprising: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; and shutting off a reverse electric current, which flows from the insoluble anode to the substrate via the plating power source, by a diode disposed between the insoluble anode and the substrate when the predetermined plating voltage is not applied.

In one embodiment of a plating method, there is provided a method for plating a substrate while preventing a generation of an electrolyte component which inhibits bottom-up plating of the substrate, comprising: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; and applying a forward voltage, which is lower than the predetermined plating voltage, between the substrate and the insoluble anode when the predetermined plating voltage is not applied, thereby decreasing a reverse electric current which flows from the insoluble anode to the substrate via the plating power source.

In one embodiment of a plating method, there is provided a method for plating of a substrate while preventing a generation of an electrolyte component which inhibits bottom-up plating of the substrate, comprising: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; controlling a concentration of the additive in the copper sulfate plating solution based on a change in the concentration of the additive in the copper sulfate plating solution by supplying an additive into the copper sulfate plating solution; and shutting off an electrical connection between the insoluble anode and the substrate when the predetermined plating voltage is not applied.

In one embodiment of a plating method, there is provided a method for plating a substrate while preventing a generation of an electrolyte component which inhibits bottom-up plating of the substrate, comprising: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; controlling a concentration of the additive in the copper sulfate plating solution based on a change in the concentration of the additive in the copper sulfate plating solution by supplying an additive into the copper sulfate plating solution; and decreasing a reverse electric current, which flows from the insoluble anode to the substrate via the plating power source, by a resistor disposed between the insoluble anode and the substrate when the predetermined plating voltage is not applied.

In one embodiment of a plating method, there is provided a method for plating a substrate while preventing a generation of an electrolyte component which inhibits bottom-up plating of the substrate, comprising: preparing a substrate having a recess formed in a surface thereof, a conductive layer being formed in at least a part of the recess; placing an insoluble anode and the substrate in contact with a copper sulfate plating solution containing an additive; applying a predetermined plating voltage between the substrate and the insoluble anode by a plating power source to plate the substrate; measuring a reverse electric current, which flows from the insoluble anode to the substrate via the plating power source, when the predetermined plating voltage is not applied; and replacing at least a part of the copper sulfate plating solution with a new plating solution if a cumulative value of the measured reverse electric current reaches a predetermined threshold value.

According to the above-described embodiments, the reverse electric current can be prevented. Therefore, it is possible to prevent a change in characteristics of the additive contained in the plating solution.

DESCRIPTION OF EMBODIMENTS

Figure 1:
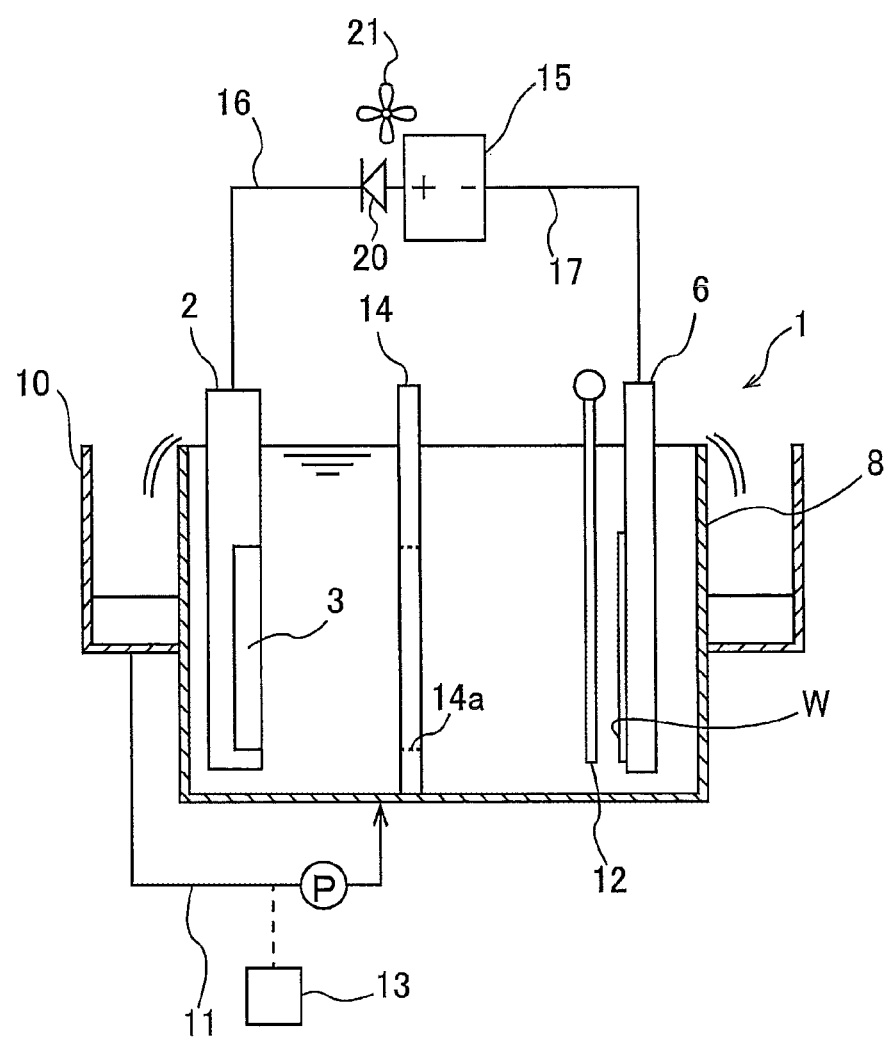
FIG. 1 is a schematic view of a plating apparatus according to an embodiment.

Embodiments will now be described with reference to the drawings. The same reference numerals are used in FIGS. 1 through 12 to refer to the same or corresponding components, and duplicate descriptions thereof are omitted. FIG. 1 is a schematic view of a plating apparatus according to an embodiment. As shown in FIG. 1, the plating apparatus includes a plating bath 1 for holding a plating solution therein, an anode 3 disposed in the plating bath 1, an anode holder 2 holding the anode 3, and a substrate holder 6 for holding a substrate W, such as a wafer. The substrate holder 6 is configured to detachably hold the substrate W and immerse the substrate W in the plating solution held in the plating bath 1. The anode 3 and the substrate W are disposed in a vertical position and opposite each other in the plating solution.

The plating bath 1 includes a storage bath 8 for storing the plating solution therein, and an overflow bath 10 adjacent to the storage bath 8. The plating solution contains additives, such as an accelerator for accelerating deposition of a metal, a suppressor for suppressing the deposition of the metal, etc. The plating solution is allowed to overflow the storage bath 8 into the overflow bath 10. The storage bath 8 and the overflow bath 10 are coupled by a circulation line 11. One end of the circulation line 11 is coupled to a bottom of the overflow bath 10, and the other end of the circulation line 11 is coupled to a bottom of the storage bath 8. The circulation line 11 is provided with a pump P. When the pump P is in motion, the plating solution in the overflow bath 10 is returned to the storage bath 8 through the circulation line 11.

The additives, such as the accelerator and the suppressor, contained in the plating solution, are consumed with the progress of plating, and therefore a concentration of each additive in the plating solution changes gradually. Therefore, in order to maintain a plating performance, it is necessary to supply the additives into the plating solution so as to control the concentration of each additive within a predetermined range. The additives may be supplied by a method which involves drawing a part of the plating solution from the circulation line 11 and supplying additives into the drawn plating solution, or a method which involves discarding a part of the plating solution and supplying a fresh plating solution containing additives at predetermined concentrations. The timing of the supply of the additives may be either when the number of plated substrates reaches a predetermined number, when an electrolytic amount reaches a predetermined value, or when the concentration of the additive(s), measured by an additive concentration measuring device 13, is lower than a predetermined threshold value.

The plating apparatus further includes a paddle 12 for agitating the plating solution in the storage bath 8, and a regulation plate 14 for regulating a distribution of electric potential on the substrate W. The regulation plate 14 is disposed between the paddle 12 and the anode 3, and has an opening 14a for restricting an electric field in the plating solution. The paddle 12 is disposed in proximity to a surface of the substrate W held by the substrate holder 6. The paddle 12 is disposed in a vertical position, and is configured to reciprocate parallel to the substrate W to agitate the plating solution so that a sufficient amount of metal ions can be supplied uniformly to the surface of the substrate W during plating of the substrate W.

The anode 3 is coupled to a positive pole of a plating power source 15 via a positive-pole-side electric wire 16, while the substrate W is coupled to a negative pole of the plating power source 15 via a negative-pole-side electric wire 17. When a voltage is applied between the anode 3 and the substrate W by the plating power source 15, an electric current flows from the anode 3 to the surface of the substrate W through the plating solution, whereby copper is deposited on the surface of the substrate W to form a copper film on the substrate W. A direction of the electric current that flows during plating of the substrate W is a forward direction. In this embodiment, an insoluble anode is used as the anode 3, and a copper sulfate plating solution is used as the plating solution. A conductor, such as titanium (Ti), coated with iridium oxide ($IrO_2$) or platinum (Pt) may be used as a material of the insoluble anode.

Figure 13:
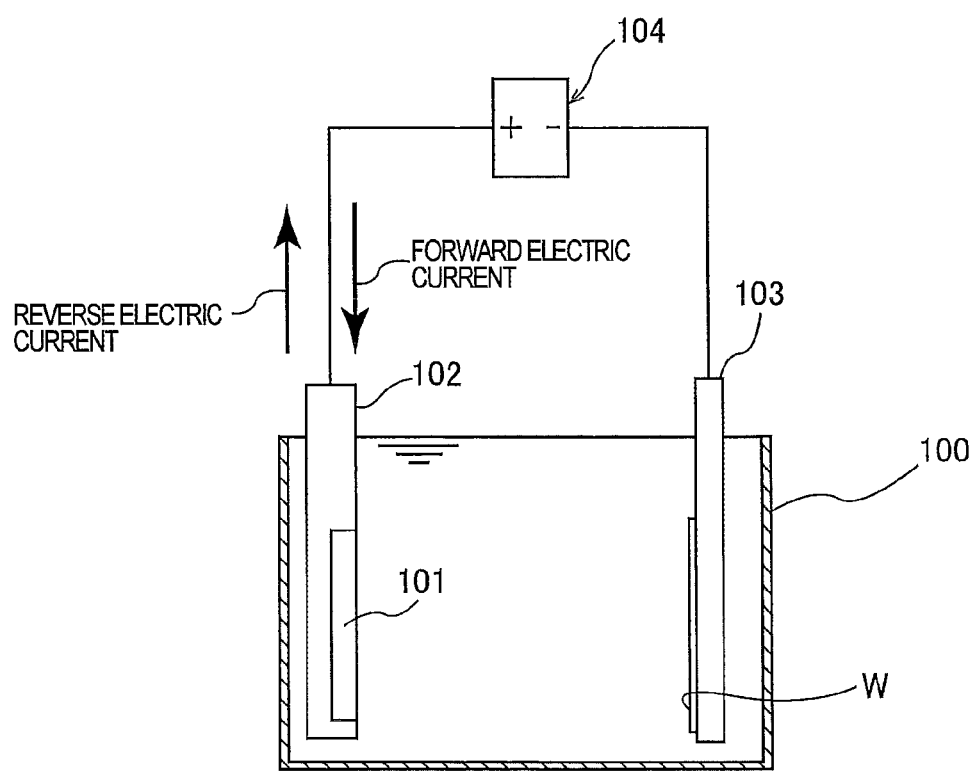
FIG. 13 is a diagram showing an exemplary plating apparatus.

Plating of the substrate W is terminated by stopping the application of the voltage. However, as described above, when the application of the voltage is stopped, a reverse electric current (see FIG. 13) flows because of a difference in spontaneous potential between the substrate W and the anode 3, and as a result, characteristics of an additive (accelerator) changes. The additive, whose characteristics have changed, inhibits the action of the additive which is used in the plating solution in order to achieve a desired morphology. More specifically, the additive, whose characteristics have changed, acts as a component that inhibits desired bottom-up plating. In view of this, in order to lower the reverse electric current, preferably to 0, the plating apparatus has a diode 20 as a reverse current preventing device which is provided between the anode 3 and the substrate W.

The diode 20 is attached to the positive-pole-side electric wire 16. The diode 20 may be attached to the negative-pole-side electric wire 17. The diode 20 is configured to permit a forward electric current to flow therethrough, while not permitting a reverse electric current to flow therethrough. The diode 20 can therefore block the reverse electric current.

The diode 20 generates heat when an electric current flows in the diode 20. The electrical properties of the diode 20 can change when a temperature of the diode 20 increases and as a result, the diode 20 may permit the flow of the reverse electric current. In view of this, a fan 21 is disposed near the plating power source 15 and the diode 20. The diode 20 is disposed in the vicinity of the plating power source 15. Therefore, the single fan 21 can cool both the plating power source 15 and the diode 20.

A withstand voltage of the diode 20 varies depending on its type. When an electromotive force is generated by a redox reaction at the substrate W and the anode 3, the reverse electric current, whose magnitude is proportional to the magnitude of the electromotive force, flows into the diode 20. In order to prevent the diode 20 from being destroyed when the reverse electric current flows into the diode 20, it is necessary to select a diode having a withstand voltage which is higher than the electromotive force. For example, in a case of 1.5-17 electromotive force, it is desirable to select a diode 20 having a withstand voltage of not less than 2.0 V.

Figure 2:
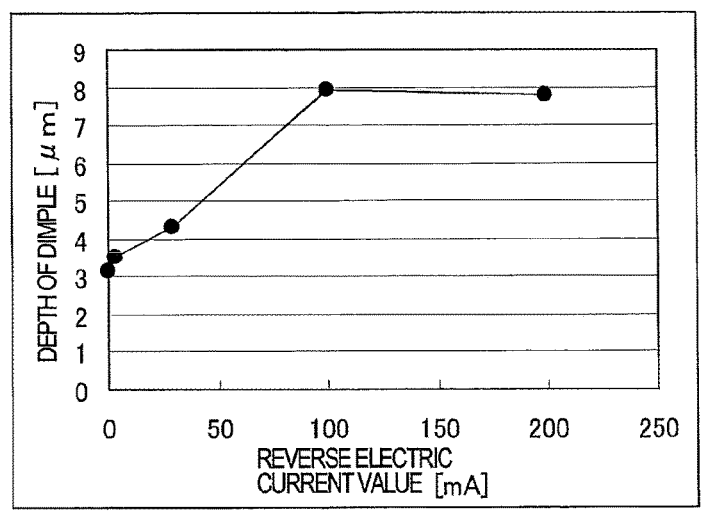
FIG. 2 is a graph showing a relationship between reverse electric current and depth of a depression in a metal film formed on a substrate.
Figure 14A:
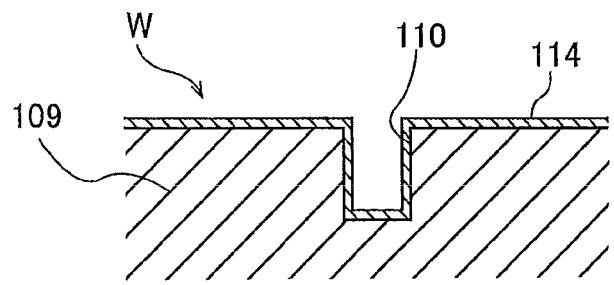
FIG. 14A is a cross-sectional view of a substrate surface, illustrating a recess formed in an dielectric film.
Figure 14B:
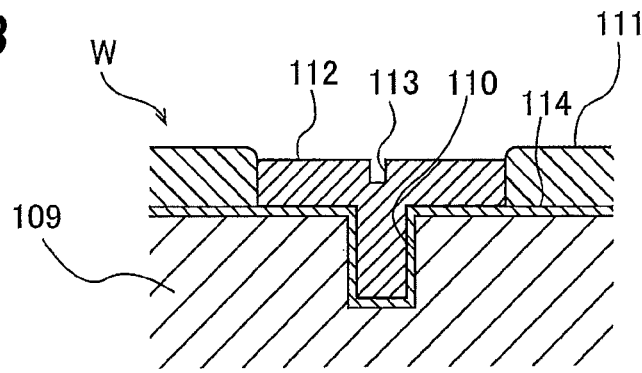
FIG. 14B is a diagram illustrating a copper film formed in a recess.
Figure 14C:
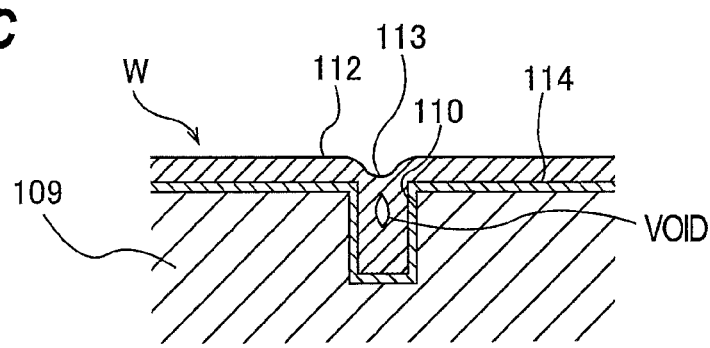
FIG. 14C is a diagram illustrating a depression formed in a surface of a copper film and a void formed in the copper film.
Figure 14D:
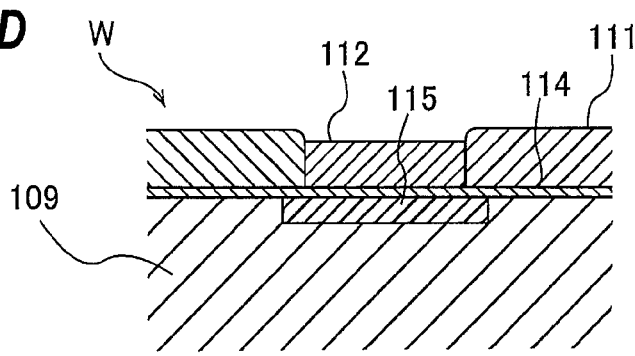
FIG. 14D is a diagram illustrating a structure in which copper is deposited in an opening of a photoresist.

FIG. 2 is a graph showing a relationship between the reverse electric current and depth of a depression (or dimple) formed in a metal film. More specifically, FIG. 2 shows results of an experiment in which copper 112 was deposited by plating in an area surrounded by a photoresist 111, shown in FIG. 14B. In this experiment, plating of a substrate was carried out while the substrate was immersed in a plating solution containing an additive, until the copper 112 was deposed on the substrate as shown in FIG. 14B. After the plating of the substrate, the substrate was left to stand as it is for 5 minutes while the substrate was kept immersed in the plating solution. When 10 seconds had elapsed since the termination of plating, measuring of the reverse electric current was conducted. Thereafter, another substrate was immersed in the plating solution and plating of that substrate was carried out. After the plating, a depth of a depression (or dimple) 113 formed in copper 112 was measured. Such sequential steps were repeated using several types of diodes having different withstand voltages.

In FIG. 2, a horizontal axis indicates measured values of the reverse electric current which varies depending on the type of diode used, and a vertical axis indicates the depth of the depression 113 formed in the copper 112. As shown in FIG. 2, the higher the reverse electric current, the deeper the depression 113. An allowable value of the depth of the depression 103 and a corresponding allowable value of the reverse electric current can be determined from the experimental results. For example, if the allowable value of the depth of the depression 103 is determined to be 5 µm, the allowable value of the reverse electric current is 50 mA. Thus, if the reverse electric current is less than 50 mA, it can be determined that the depression (or dimple) 113 formed in the copper film is small.

Figure 3:
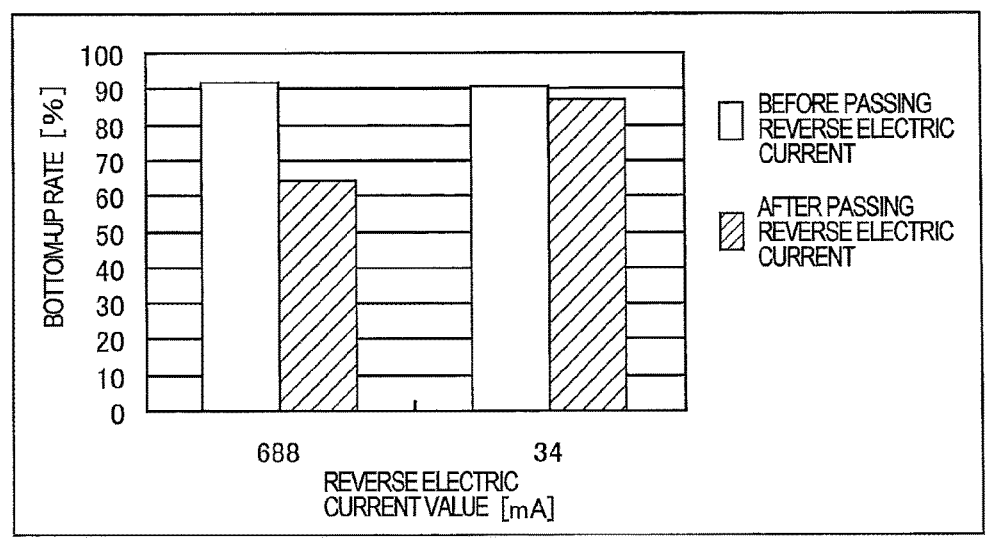
FIG. 3 is a graph showing a relationship between reverse electric current and bottom-up rate of copper deposited in a recess.

FIG. 3 is a graph showing results of an experiment which was conducted to examine a relationship between reverse electric current and bottom-up rate of copper deposited in a recess. In this experiment, plating was carried out on a substrate, having a recess of a high aspect ratio, to deposit copper in the recess. After the deposition of copper in the recess, a reverse electric current was intentionally passed to change characteristics of an additive in a plating solution. Thereafter, another substrate was immersed in the plating solution and plating of that substrate was carried out. After the plating, the bottom-up rate of copper was calculated. The bottom-up rate of copper is a ratio of a height of copper deposited in the recess to the depth of the recess (i.e., the bottom-up rate=the height of copper/the depth of recess× 100).

In FIG. 3, a horizontal axis indicates the reverse electric current, and a vertical axis indicates the bottom-up rate of copper. White bars each indicate the bottom-up rate of copper before the reverse electric current was passed, and shaded bars each indicate the bottom-up rate of copper after the reverse electric current was passed. FIG. 3 shows results of an experiment in which a 688-mA reverse electric current was passed for 120 seconds, and also shows results of an experiment in which a 34-mA reverse electric current was passed for 200 seconds. As can be seen from the experimental results shown in FIG. 3, the higher the reverse electric current, the lower the bottom-up rate of copper.

Although an ideal diode can completely prevent an electric current from flowing in the reverse direction, a slight reverse electric current actually flows through a diode. If a high reverse electric current flows through the diode, the reverse electric current can affect an additive in the plating solution. Thus, it is preferred to select a diode to be used based on the above-described experimental results. For example, if the allowable value of the reverse electric current is 50 mA, a diode, which permits a reverse electric current of less than 50 mA to flow, is used. Thus, in order to securely prevent the characteristics of the additive in the plating solution from changing due to the reverse electric current, it is preferred to determine an allowable value of the reverse electric current based on the experimental results and to select a diode based on the determined allowable value.

Figure 4:
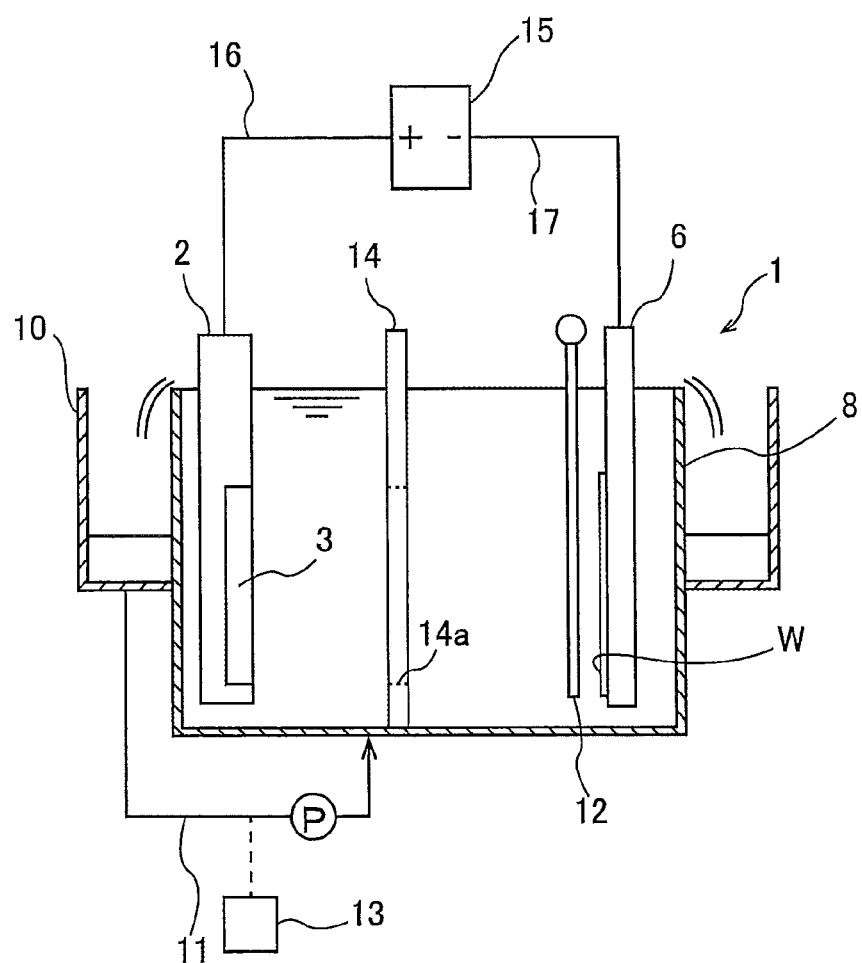
FIG. 4 is a diagram showing another embodiment of a plating apparatus.

FIG. 4 is a diagram showing a plating apparatus according to another embodiment. The plating apparatus of this embodiment is configured to apply a voltage between the anode 3 and a substrate W in order to prevent the reverse electric current. As shown in FIG. 4, the plating apparatus of this embodiment is not provided with the diode. Instead, the plating power source 15 is configured to switch the voltage between a first voltage and a second voltage. The first voltage is a predetermined plating voltage which is necessary for plating the substrate W. The second voltage is a forward voltage which is higher than an electromotive force (or a potential difference) produced between the anode 3 and the substrate W when the first voltage (plating voltage) is not applied between them.

The second voltage is set to be lower than the first voltage. More specifically, a magnitude of the second voltage is such that the application of the second voltage does not affect plating of the substrate W. When the second voltage is applied between the anode 3 and the substrate W, a forward electric current flows from the anode 3 through the plating solution to the substrate W. This forward electric current is lower than a forward electric current that flows when the first voltage is applied between the anode 3 and the substrate W. Therefore, during the application of the second voltage, plating of the substrate W does not substantially progress and, in addition, a reverse electric current is prevented.

The plating apparatus of this embodiment is operated as follows. Immediately after a substrate W is immersed in the plating solution, the plating power source 15 applies the second voltage (which is the forward voltage) between the substrate W and the anode 3. The application of the second voltage prevents a generation of a reverse electric current, thereby preventing a change in the characteristics of the additive contained in the plating solution. Next, the plating power source 15 applies the first voltage (which is the plating voltage) between the substrate W and the anode 3 to start plating of the substrate W. During the application of the first voltage, a metal is deposited on the surface of the substrate W to form a copper film on the substrate W. After a predetermined time has elapsed since plating is started, the application of the first voltage is stopped, so that plating is terminated. Immediately after the termination of plating, the plating power source 15 applies the second voltage (forward voltage) between the anode 3 and the substrate W to prevent a generation of a reverse electric current. Accordingly, the characteristics of the additive do not change even after the termination of plating. After the termination of plating, the substrate W, together with the substrate holder 6, is pulled out of the plating solution by means of a not-shown transport mechanism.

A conductive layer, such as a seed layer (see reference numeral 114 in FIGS. 14A through 14D), is formed on the surface of the substrate W to be plated. If a reverse electric current is passed to the substrate W before plating of the substrate W, the conductive layer can dissolve in the plating solution. In particular, the conductive layer formed on a side surface of a recess, having a high aspect ratio, tends to be thin. Therefore, if a reverse electric current flows before plating of the substrate W, the conductive layer on the side surface of the recess can dissolve in the plating solution, resulting in a failure to form a metal film on the side surface of the recess. In order to prevent such dissolution of the conductive film, the second voltage (which is the forward voltage) is applied before plating of the substrate W so as to prevent the generation of the reverse electric current.

Figure 5:
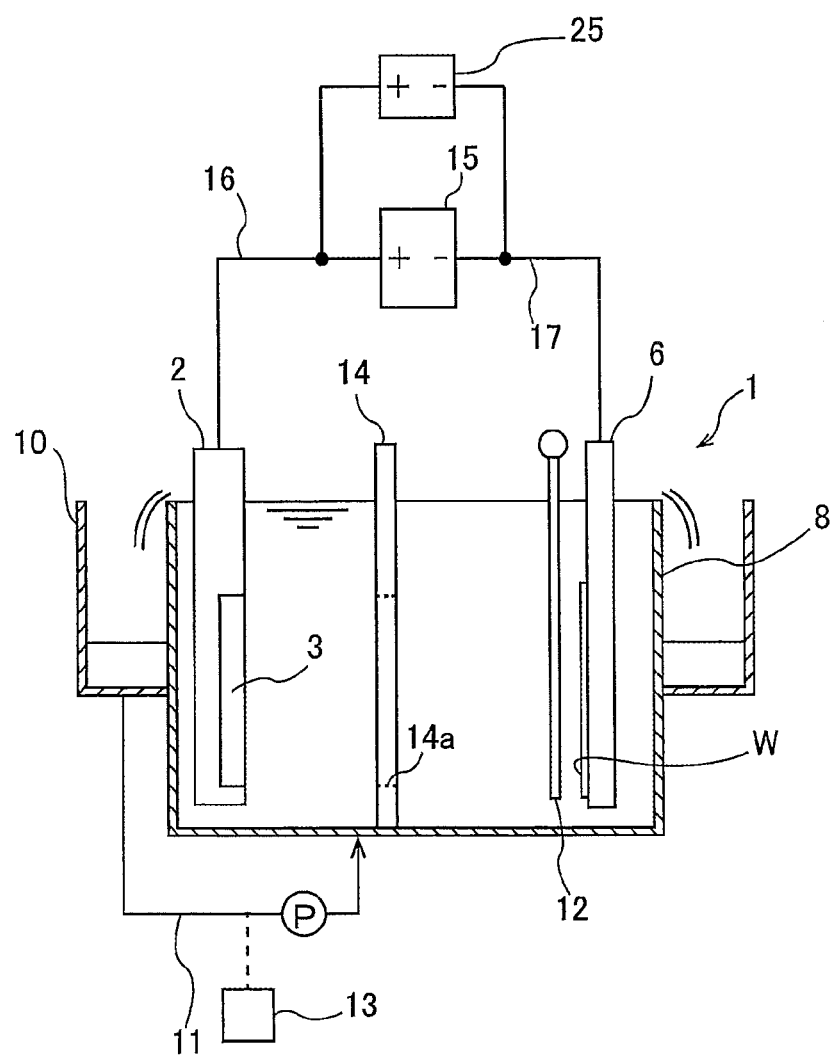
FIG. 5 is a diagram showing an embodiment of a plating apparatus having an auxiliary power source.

As shown in FIG. 5, it is possible to provide an auxiliary power source 25 separately from the plating power source 15 and apply the second voltage from the auxiliary power source 25. The auxiliary power source 25 is coupled in parallel with the plating power source 15. In particular, the auxiliary power source 25 is coupled to the positive-pole-side electric wire 16 and to the negative-pole-side electric wire 17. The auxiliary power source 25 applies the second voltage (forward voltage) during a period of time from the immersion of the substrate W in the plating solution until the start of plating and during a period of time from the termination of plating until the pulling of the substrate W out of the plating solution. The plating power source 15 applies the first voltage (plating voltage) during plating of the substrate W. The generation of the reverse electric current can be prevented also by applying the second voltage from the auxiliary power source 25 in this manner.

The plating power source 15 may be configured to switch the electric current between a first electric current and a second electric current instead of switching the voltage. The first electric current and the second electric current are forward electric currents. The first electric current is an electric current to plate the substrate W, while the second electric current is an electric current to prevent the reverse electric current. The second electric current is not lower than the reverse electric current that is generated when plating of the substrate W is not performed. The second electric current is lower than the first electric current, and a magnitude of the second electric current is such that passing of the second electric current does not affect plating of the substrate W.

Instead of passing the second electric current from the plating power source 15, the auxiliary power source 25 may pass the second electric current between the anode 3 and the substrate W. In that case, the auxiliary power source 25 passes the second electric current during a period of time from the immersion of the substrate W in the plating solution until the start of plating and during a period of time from the termination of plating until the pulling of the substrate W out of the plating solution.

Figure 6:
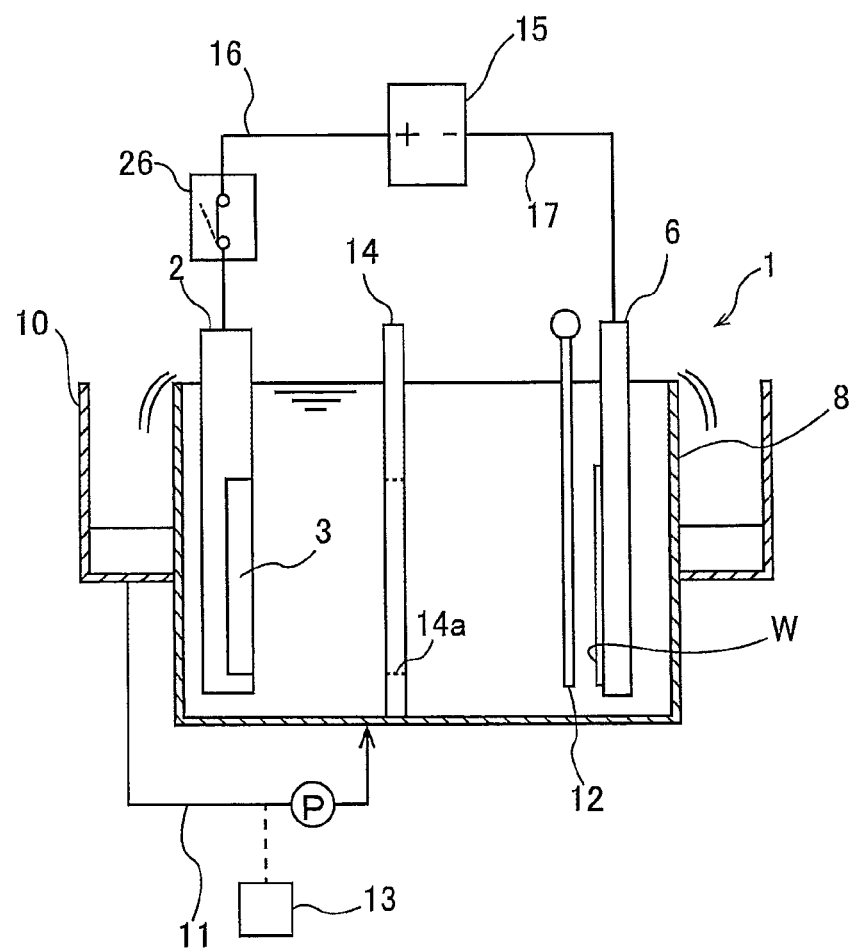
FIG. 6 is a diagram showing an embodiment of a plating apparatus having a switch.

FIG. 6 is a diagram showing yet another embodiment of a plating apparatus. The plating apparatus has a switch 26 for shutting off the electrical connection between the plating power source 15 and the anode 3. The switch 26 is attached to the positive-pole-side electric wire 16 that couples the plating power source 15 and the anode 3. When the switch 26 is opened, the electrical connection between the plating power source 15 and the anode 3 is shut off, and therefore the reverse electric current cannot flow. The switch 26 may be attached to the negative-pole-side electric wire 17 so as to shut off the electrical connection between the plating power source 15 and a substrate W.

The plating apparatus of this embodiment is operated as follows. First, the switch 26 is opened, and in this state a substrate W is immersed in the plating solution. Next, the switch 26 is closed and, at the same time, the plating power source 15 applies a voltage between the anode 3 and the substrate W to start plating of the substrate W. Immediately after the termination of plating of the substrate W, the switch 26 is opened again. The substrate W, together with the substrate holder 6, is then pulled out of the plating solution by means of a not-shown transport mechanism. The generation of the reverse electric current can be prevented by thus keeping the switch 26 open during the period of time from the immersion of the substrate W in the plating solution until the start of plating and during the period of time from the termination of plating until the pulling of the substrate W out of the plating solution.

Figure 7:
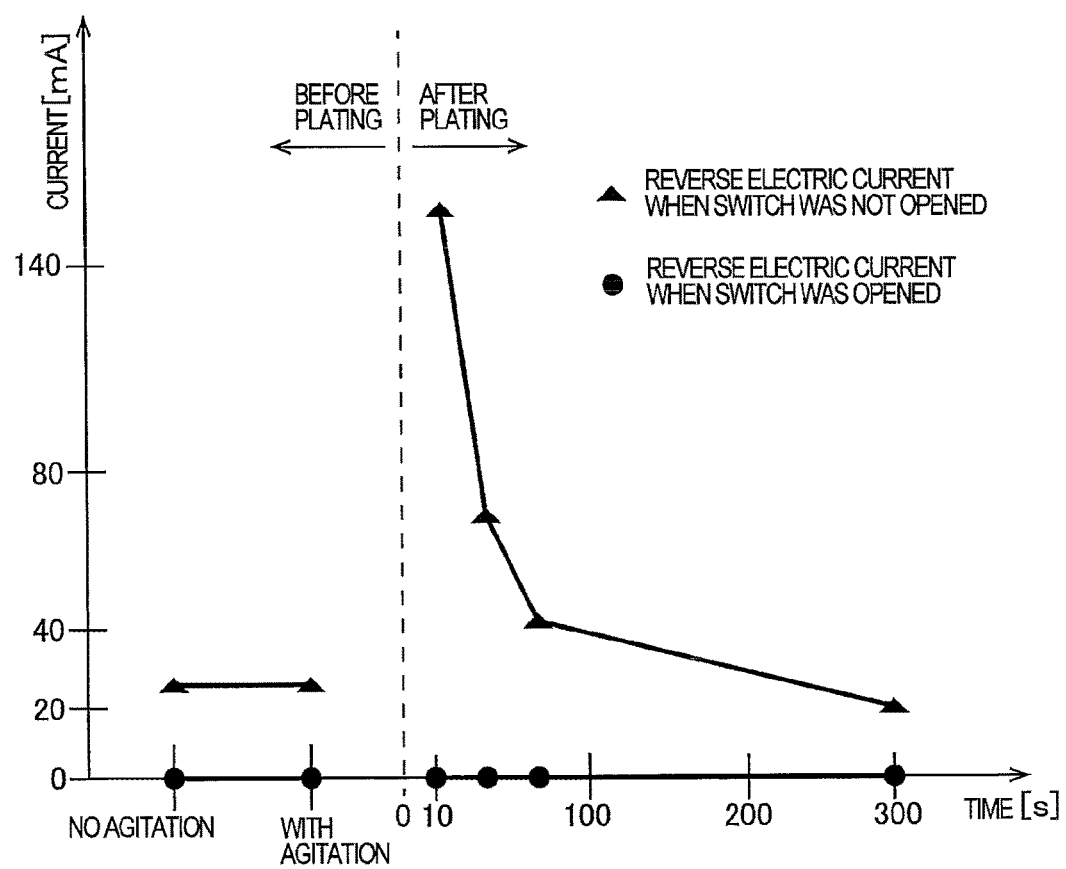
FIG. 7 is a graph showing results of an experiment which was conducted to examine a generation of the reverse electric current in the cases of opening and not opening the switch.

FIG. 7 is a graph showing results of an experiment which was conducted to examine the generation of the reverse electric current in the cases of opening and not opening the switch 26. A horizontal axis indicates time, and a vertical axis indicates measured values of the reverse electric current. FIG. 7 shows reverse electric current values before the start of plating and reverse electric current values after the plating. Triangular marks indicate reverse electric current values in the case where the switch 26 was not opened, and circular marks indicate reverse electric current values in the case where the switch 26 was opened.

As shown in FIG. 7, in the case where the switch 26 was not opened, a reverse electric current of about 25 mA flowed before plating of the substrate W was started, whereas in the case where the switch 26 was opened, no reverse electric current flowed before plating of the substrate W was started. There is no difference in value of the reverse electric current between the case where the plating solution was agitated and the case where the plating solution was not agitated.

In the case where the switch 26 was not opened, a reverse electric current of about 150 mA flowed at a point in time when 10 seconds had elapsed since the termination of plating. The reason why a high reverse electric current flows immediately after the termination of plating is that the concentration of dissolved oxygen in the plating solution is high at the termination of plating, and therefore the potential difference between the anode 3 and the substrate W is large. More specifically, the concentration of dissolved oxygen in the plating solution is high immediately after the termination of plating due to an oxygen gas generated at the anode 3 during plating. With the high concentration of the dissolved oxygen, the spontaneous potential of the substrate W shifts toward the minus side as a result of an increase in an electric current caused by the reduction reaction of the dissolved oxygen. Accordingly, the potential difference between the anode 3 and the substrate W increases, and therefore a high reverse electric current flows. Although the value of the reverse electric current gradually decreases with time, the reverse electric current of about 20 mA still flows even when 300 seconds have elapsed since the termination of plating.

In contrast, in the case where the switch 26 was opened, the value of the reverse electric current was 0. Thus, the reverse electric current can be decreased to 0 by opening the switch 26 to shut off the electrical connection between the anode 3 and the substrate W. This can prevent a change in the characteristics of the additive, thus making it possible to form a metal film having a uniform thickness on the surface of the substrate W.

Figure 8:
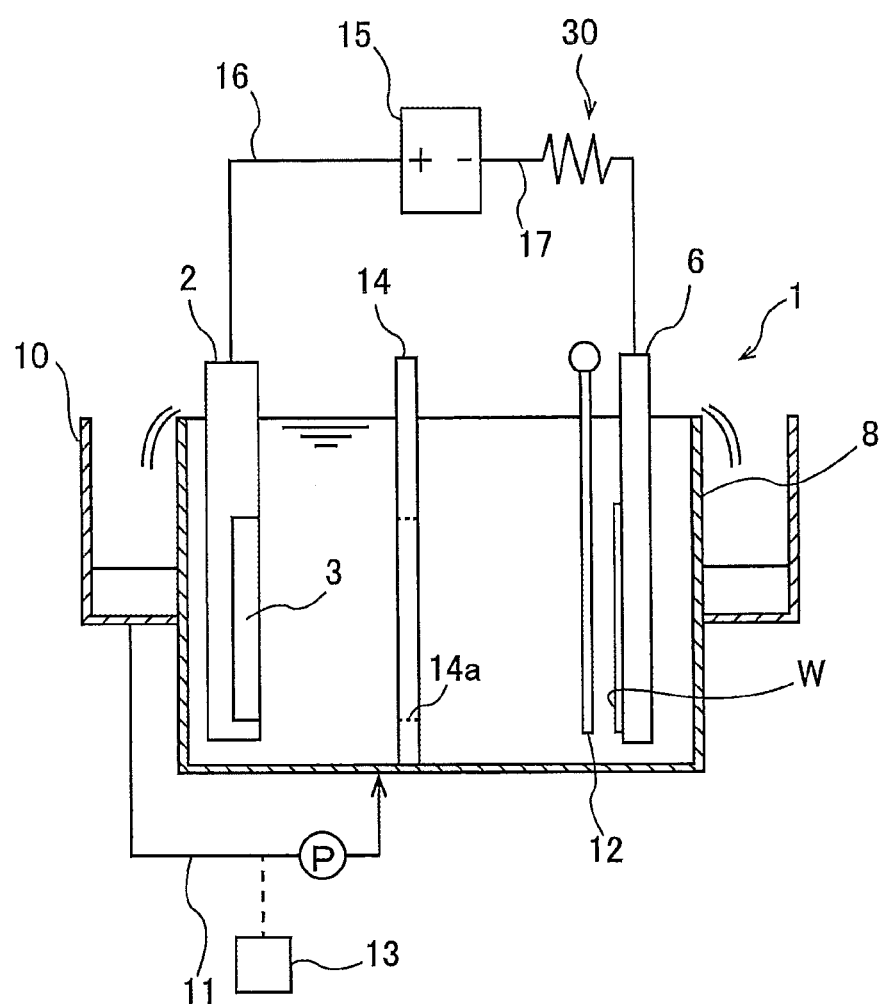
FIG. 8 is a diagram showing an embodiment of a plating apparatus having a resistor.

As shown in FIG. 8, instead of the switch 26, a resistor 30 for decreasing the reverse electric current may be provided between the anode 3 and the substrate W. The resistor 30 is attached to the negative-pole-side electric wire 17 in FIG. 8, while the resistor 30 may be attached to the positive-pole-side electric wire 16.

Figure 9:
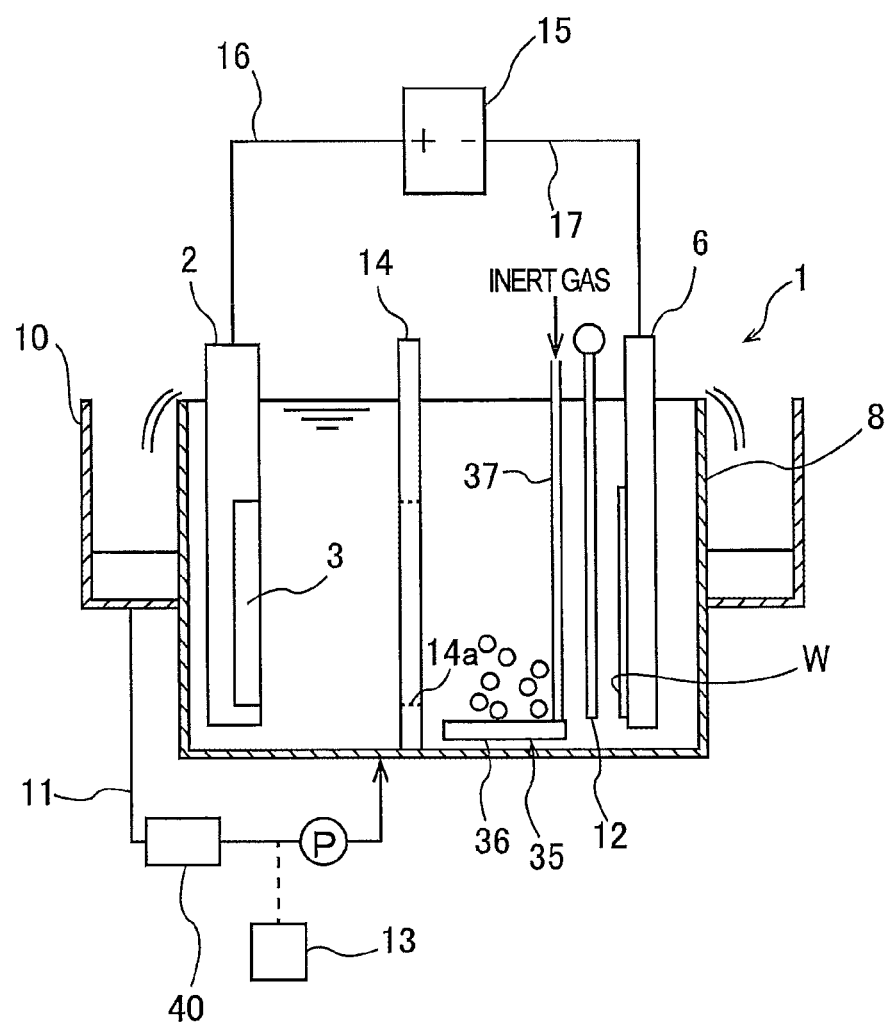
FIG. 9 is a diagram showing an embodiment of a plating apparatus having an inert gas supply unit and a deaerator.

FIG. 9 is a diagram showing yet another embodiment of a plating apparatus. As shown in FIG. 9, the plating apparatus has, as devices for decreasing the reverse electric current, an inert gas supply unit 35 for supplying an inert gas, such as a nitrogen gas, into the plating solution, and a deaerator 40 for deaerating the plating solution in the plating bath 1. The inert gas supply unit 35 and the deaerator 40 are configured to lower the concentration of dissolved oxygen in the plating solution, thereby decreasing the reverse electric current.

The inert gas supply unit 35 includes a diffuser pipe 36 disposed at the bottom of the plating bath 1, and an inert gas supply line 37 for supplying the inert gas to the diffuser pipe 36. The inert gas supply unit 35 can reduce the concentration of dissolved oxygen in the plating solution by supplying the inert gas into the plating solution, and can therefore weaken the redox reaction between the substrate W and the anode 3, thereby decreasing the reverse electric current.

The inert gas is supplied into the plating solution preferably during plating of the substrate W, i.e., during the application of the first voltage (which is the plating voltage), and during the period of time from the termination of plating until the pulling of the substrate W out of the plating solution. The supply of the inert gas can prevent an increase in the concentration of dissolved oxygen in the plating solution during plating of the substrate and, in addition, can reduce the concentration of dissolved oxygen in the plating solution even after the termination of plating, thereby decreasing the reverse electric current.

The deaerator 40 is attached to the circulation line 11 that couples the storage bath 8 and the overflow bath 10, and removes the dissolved oxygen from the plating solution flowing in the circulation line 11. The deaerator 40 can therefore weaken the redox reaction between the substrate W and the anode 3, thereby decreasing the reverse electric current. While the plating apparatus according to the embodiment illustrated in FIG. 9 has the inert gas supply unit 35 and the deaerator 40, a plating apparatus according to another embodiment may have only one of the inert gas supply unit 35 and the deaerator 40.

The advantage of lowering the concentration of dissolved oxygen in the plating solution by the inert gas supply unit 35 and the deaerator 40 is not only the decrease in the reverse electric current. That is, if the concentration of dissolved oxygen in the plating solution is high, the additive, in particular the accelerator, will be oxidized and decomposed by the oxygen in the plating solution and thus consumed. The inert gas supply unit 35 and the deaerator 40 can lower the concentration of dissolved oxygen in the plating solution, thereby preventing the oxidative decomposition of the additive.

Figure 10:
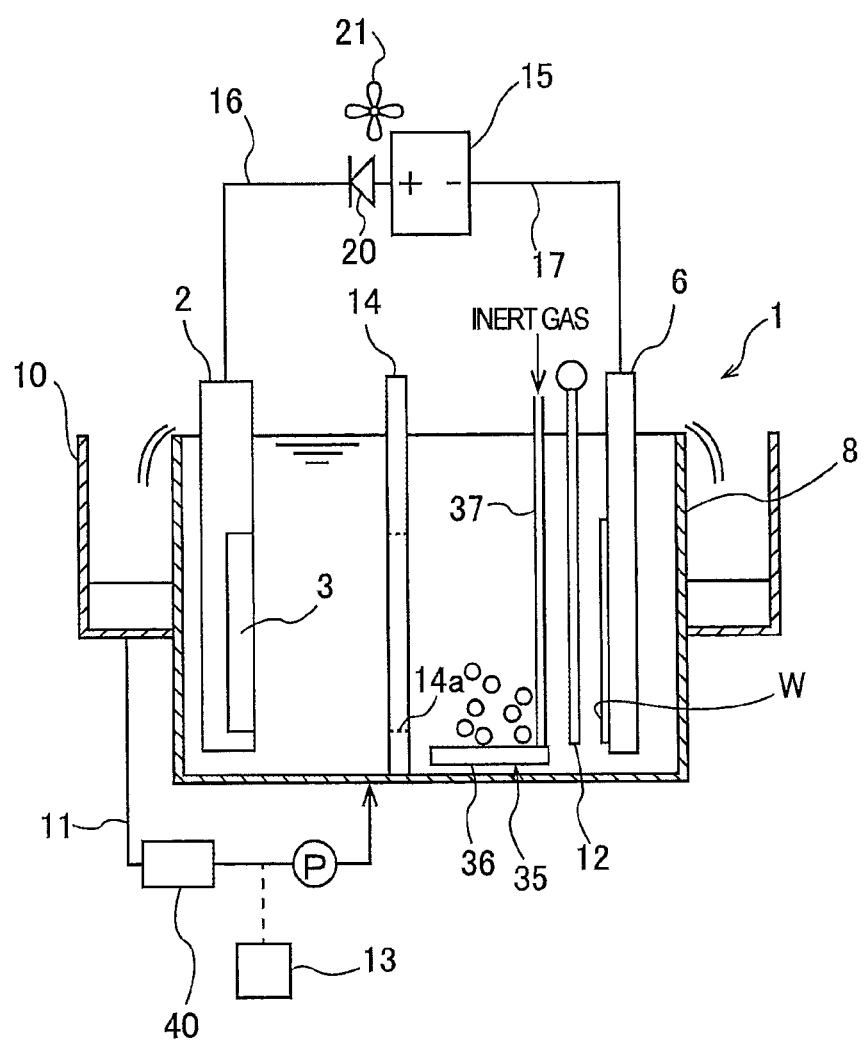
FIG. 10 is a diagram showing an embodiment of a plating apparatus having a diode, an inert gas supply unit, and a deaerator.

The embodiment illustrated in FIG. 9 may be appropriately combined with the previously-discussed embodiments. For example, as shown in FIG. 10, the diode 20, the inert gas supply unit 35, and the deaerator 40 may be used in combination. Of course, the diode 20 may be used in combination with one of the inert gas supply unit 35 and the deaerator 40. Such combinations make it possible to lower the concentration of dissolved oxygen in the plating solution, while preventing the oxidative decomposition of the additive in the plating solution and preventing the reverse electric current from flowing. Since the concentration of dissolved oxygen in the plating solution is lowered, the potential difference between the substrate W and the anode 3 can be reduced. As a result, a diode having a relatively low withstand voltage can be used.

The embodiment illustrated in FIG. 9 may be combined with the embodiment illustrated in FIG. 4. In that case, the inert gas is supplied before and after the application of the first voltage (plating voltage) between the substrate W and the anode 3, i.e., during the application of the second voltage.

Figure 11:
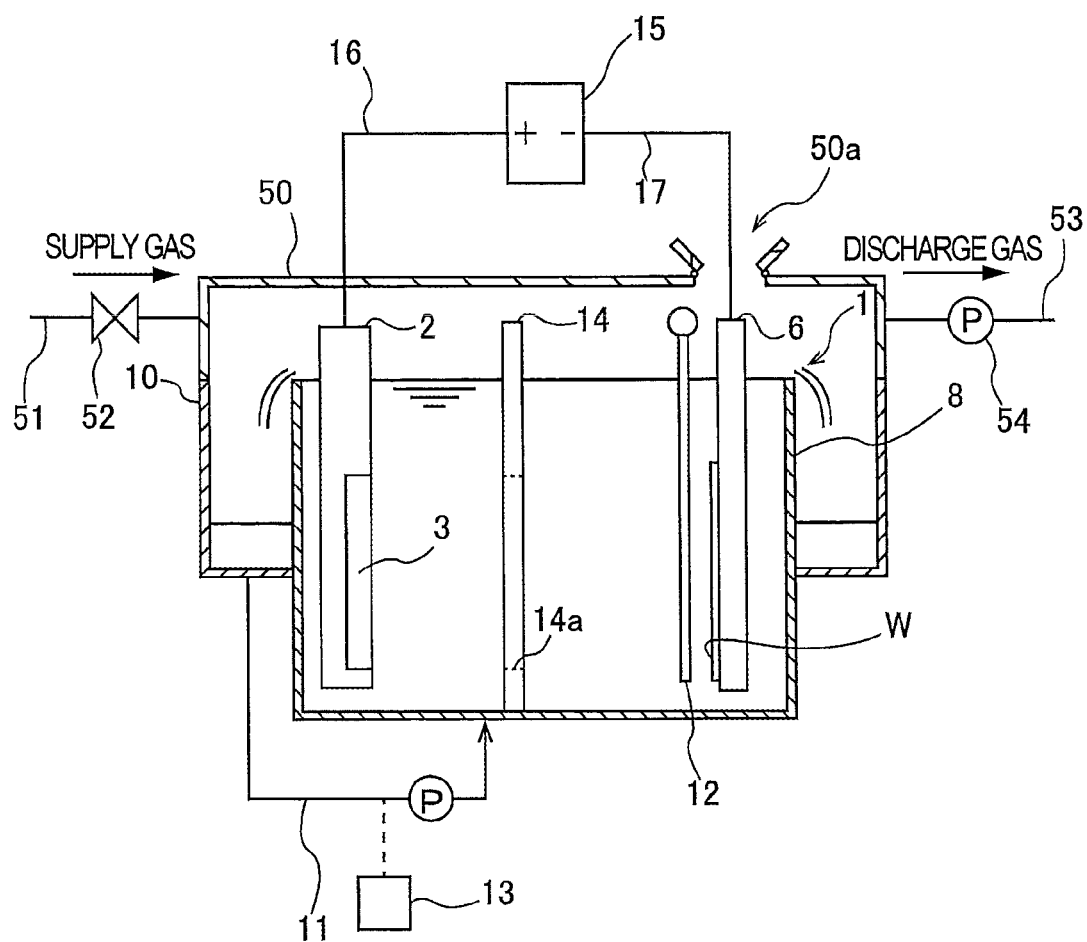
FIG. 11 is a diagram showing an embodiment of a plating apparatus having a lid.

As shown in FIG. 11, the plating apparatus may have a lid 50, which can be opened and closed, on the top of the plating bath 1 in order to prevent contact of the air with the plating solution in the plating bath 1. FIG. 11 is a diagram showing the plating apparatus having the lid 50. The lid 50 covers the plating bath 1 (i.e., the storage bath 8 and the overflow bath 10), and has a door 50a. The substrate holder 6 is carried into and out of the plating bath 1 through the door 50a.

An inert gas introduction line 51 for introducing an inert gas, such as a nitrogen gas, is coupled to the lid 50. This inert gas introduction line 51 is provided with an on-off valve 52. An exhaust line 53, which is provided with an evacuation device 54, is also coupled to the lid 50. When the door 50a is in the closed state, the on-off valve 52 is opened to introduce the inert gas into the plating bath 1 through the inert gas introduction line 51 and, at the same time, the evacuation device 54 is actuated. The air in contact with the plating solution is purged through the exhaust line 53, until a space between the lid 50 and the surface of the plating solution is filled with the inert gas. Thus, the plating solution in the plating bath 1 does not contact oxygen in the air.

The door 50a is opened when the substrate holder 6 is to be carried into the plating bath 1, and the substrate holder 6 is set at a predetermined position in the plating bath 1. The door 50a is closed again after the substrate holder 6 is set. The lid 50 and the inert gas introduction line 51 can break the contact between the plating solution and the air, thereby reducing an amount of oxygen dissolved in the plating solution.

Figure 12:
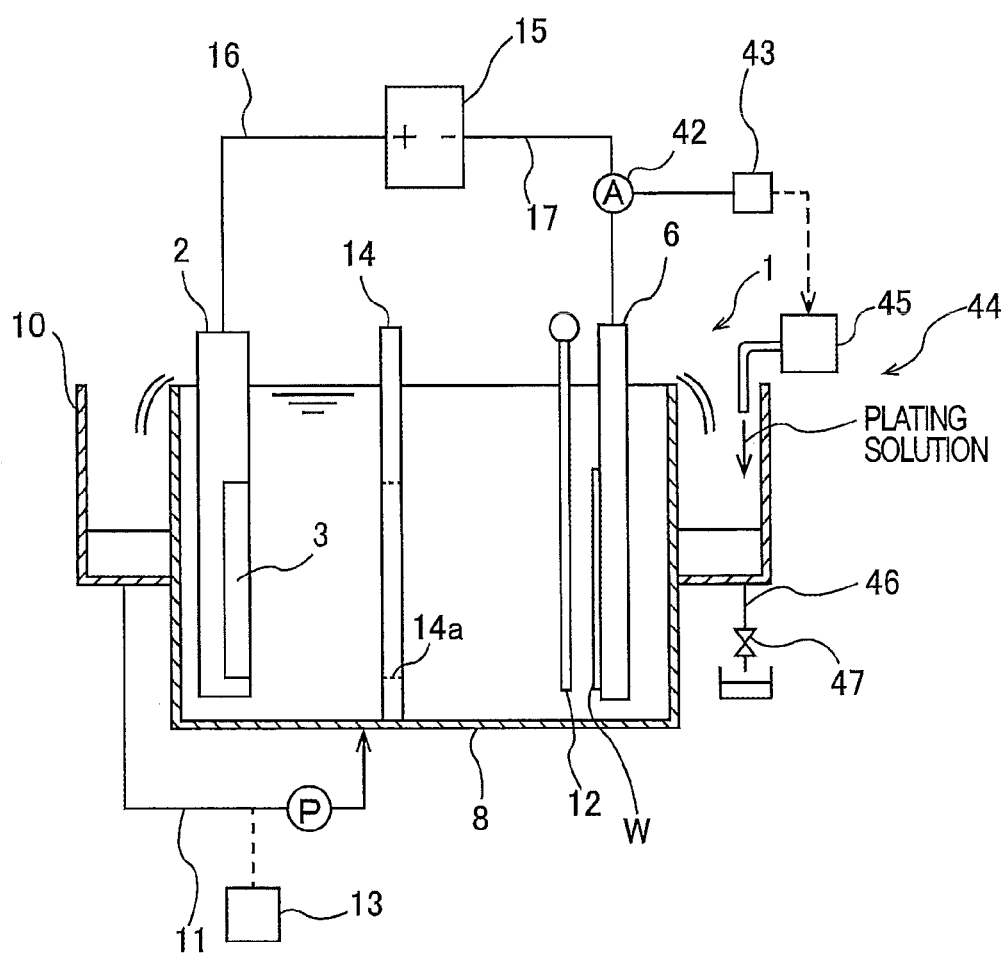
FIG. 12 is a diagram showing an embodiment of a plating apparatus having an ammeter, a cumulative current calculator, and a plating-solution replacing device.

FIG. 12 is a diagram showing yet another embodiment of a plating apparatus. As shown in FIG. 12, the plating apparatus has an ammeter 42 for measuring the reverse electric current. The ammeter 42 is attached to the negative-pole-side electric wire 17. The ammeter 42 may be attached to the positive-pole-side electric wire 16. A cumulative current calculator 43 is coupled to the ammeter 42. This cumulative current calculator 43 is configured to accumulate current values, measured by the ammeter 42, to calculate a cumulative value of the reverse electric current.

A plating-solution replacing device 44 for replacing at least a part of the plating solution in the plating bath 1 with a new plating solution is coupled to the cumulative current calculator 43. This plating-solution replacing device 44 includes a plating solution supply device 45 for supplying a new plating solution into the plating bath 1, and a discharge line 46 for discharging the used plating solution from the plating bath 1. The plating solution supply device 45 is configured to supply a new plating solution into the overflow bath 10. The discharge line 46 is coupled to the bottom of the overflow bath 10. The discharge line 46 includes a discharge valve 47 so that the plating solution is discharged from the overflow bath 10 when the discharge valve 47 is opened.

The ammeter 42 measures the reverse electric current and sends measured values of the reverse electric current to the cumulative current calculator 43. The cumulative current calculator 43 is configured to accumulate the measured values of the reverse electric current to calculate the cumulative value of the reverse electric current. When the cumulative value reaches a predetermined threshold value, the cumulative current calculator 43 sends a plating-solution replacement command signal to the plating-solution replacing device 44. Upon receiving this plating-solution replacement command signal, the discharge line 46 opens the discharge valve 47 to discharge the plating solution from the overflow bath 10. Subsequently, the plating solution supply device 45 supplies a new plating solution into the overflow bath 10. In this manner, at least a part of the plating solution in the plating bath 1 is replaced with a new plating solution when the cumulative value of the reverse electric current reaches a predetermined value, so that an increase in an amount of the additive whose characteristics have changed can be prevented.

In general, in order to prevent a by-product of an additive from accumulating in the plating bath 1, supply and discharge of the plating solution are repeated periodically. According to the embodiments described above, the reverse electric current can be decreased, and therefore the generation of such a by-product can be prevented. Therefore, an amount of the plating solution to be supplied and to be discharged can be reduced. For example, the amount of the plating solution to be supplied and to be discharged can be reduced to $1/10$ if the reverse electric current is decreased to $1/10$.

The elements shown in FIGS. 1, 4, 5, 6, 8, 9, 11 and 12 may be appropriately combined.

Although the embodiments of the present invention have been described above, it should be understood that the present invention is not limited to the above embodiments, and various changes and modifications may be made without departing from the scope of the technical concept of the present invention.

What is claimed is:

1. A method for plating a substrate while preventing a generation of an electrolyte component which inhibits bottom-up plating of the substrate, comprising:
   preparing a substrate having a recess formed in a surface thereof, a conductive layer being formed in at least a part of the recess;
   providing a diode whose allowable value of a reverse electric current has been selected based on a predetermined allowable depth of a dimple that can be formed in the conductive layer of the substrate to be plated;
   placing an insoluble anode and the substrate in contact with a copper sulfate plating solution containing an additive;
   applying a predetermined plating voltage between the substrate and the insoluble anode by a plating power source to plate the substrate; and
   disposing the diode between the insoluble anode and the substrate to reduce a reverse electric current that flows from the insoluble anode to the substrate via the plating power source when the predetermined plating voltage is not applied.

2. The method according to claim 1, wherein an inert gas is supplied into the copper sulfate plating solution while applying the predetermined plating voltage between the substrate and the insoluble anode, thereby lowering a concentration of dissolved oxygen in the copper sulfate plating solution.

3. The method according to claim 1, wherein the allowable value of the reverse electric current is lower than a value of the reverse electric current corresponding to the allowable depth of the dimple.

4. The method according to claim 1, further comprising:
   cooling both the plating power source and the diode by a fan, the diode being located adjacent to the plating power source.

5. The method according to claim 1, wherein the allowable value of the reverse electric current has been selected based on experimental data showing a relationship between reverse electric current and depth of a dimple formed in a metal film, the selected allowable value of the reverse electric current corresponding to the predetermined allowable depth of a dimple that can be formed in the conductive layer of the substrate to be plated.

* * * * *